United States Patent
Kuhmann et al.

(10) Patent No.: US 8,309,973 B2
(45) Date of Patent: Nov. 13, 2012

(54) SILICON-BASED SUB-MOUNT FOR AN OPTO-ELECTRONIC DEVICE

(75) Inventors: Jochen Kuhmann, Berlin (DE); Heike Huscher, Berlin (DE)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/369,993

(22) Filed: Feb. 12, 2009

(65) Prior Publication Data

US 2010/0200888 A1 Aug. 12, 2010

(51) Int. Cl.
*H01L 27/15* (2006.01)
(52) U.S. Cl. ............... 257/81; 257/622; 438/701
(58) Field of Classification Search .............. None
See application file for complete search history.

(56) References Cited

U.S. PATENT DOCUMENTS

| | | | | |
|---|---|---|---|---|
| 6,114,240 | A * | 9/2000 | Akram et al. | 438/667 |
| 6,806,583 | B2 | 10/2004 | Koay et al. | |
| 6,818,464 | B2 | 11/2004 | Heschel | |
| 7,732,829 | B2 | 6/2010 | Murphy | |
| 2002/0096994 | A1* | 7/2002 | Iwafuchi et al. | 313/495 |
| 2002/0123164 | A1* | 9/2002 | Slater et al. | 438/39 |
| 2004/0129992 | A1 | 7/2004 | Shibayama | |
| 2004/0248377 | A1* | 12/2004 | Yoo et al. | 438/458 |
| 2005/0241135 | A1 | 11/2005 | Heschel et al. | |
| 2006/0054910 | A1 | 3/2006 | Takemori et al. | |
| 2006/0210234 | A1 | 9/2006 | Shiv et al. | |
| 2007/0020926 | A1 | 1/2007 | Kalvesten et al. | |
| 2007/0246724 | A1 | 10/2007 | Wen et al. | |
| 2008/0076195 | A1 | 3/2008 | Shiv | |
| 2008/0170396 | A1* | 7/2008 | Yuan et al. | 362/244 |
| 2008/0203420 | A1* | 8/2008 | Higaki et al. | 257/99 |

FOREIGN PATENT DOCUMENTS

| | | |
|---|---|---|
| EP | 1 775 766 | 4/2007 |
| SE | 526 366 | 8/2005 |

OTHER PUBLICATIONS

S.M. Sze. Physics of Semiconductor Devices, second edition. United States of America: John Wiley & Sons, Inc., 1981.*
Bauer, "First High Volume Via Process for Packaging and Integration of MEMS/CMOS," Silex Microsystems, Bruttovagen 3, SE-17543 Jarfalla, Sweden, 6 pages.
Dr. V. Kripesh, Institute of Microelectronics, Singapore, EMC-3D Seminar, Silicon Substrate Technology for SIP Modules, Jan. 23, 2007, 11 pages.
M. Puech et al., DRIE for Through Silicon Via, Alcatel Micro Machining Systems, Semiconductor 3-D Equipment and Materials Consortium, 26 pages.
R. Hauffe et al., "Optimized Microvia Technology for High Density and High Frequency (>40GHz) Hermetic Through-Wafer Connections in Silicon Substrates," IEEE Electronic Components and Technology Conference Proceedings, pp. 324-330 (May 31-Jun. 3, 2005).

* cited by examiner

*Primary Examiner* — Fei Fei Yeung Lopez
(74) *Attorney, Agent, or Firm* — Haynes and Boone, LLP

(57) ABSTRACT

A package for an optoelectronic device (e.g., a light emitting device such as a LED) includes a sub-mount including a silicon substrate having a thickness in the range of 350 µm-700 µm. The optoelectronic device is mounted on a die attach pad on the front-side surface of the substrate. Feed-through metallization in one or more via structures electrically couples the die attach pad to a contact pad on the back-side surface of the substrate.

18 Claims, 7 Drawing Sheets

SILICON-BASED SUB-MOUNT FOR AN OPTO-ELECTRONIC DEVICE

TECHNICAL FIELD

The present disclosure relates to a silicon-based sub-mount for an optoelectronic device.

BACKGROUND

Optoelectronic devices, such as light emitting diodes (LEDs), have various applications in consumer electronics. High-brightness LEDs, for example, can be used as light sources in space-limited applications where thermal management is important. The LEDs are optimized for display backlighting and illumination in automotive and transport, consumer, and general applications. Typical end-products include mobile telephone displays, flashes for cameras, retail and window displays, emergency lighting and signs, household appliances, and automotive instrument panels and exterior lighting, such as brake lights and turn signals.

Some high brightness LED packages are ceramic-based or employ plastic leadless chip carriers (PLCCs). Silicon-based packages, however, can facilitate manufacturing of the packages by leveraging mature silicon processing techniques.

In one example, a LED chip is mounted within a recess of a silicon sub-mount. The recess serves as a reservoir that can be filled with a color-conversion material (e.g., phosphor silicone) to control the color of the light emitted from the package.

Some high-power LED white light applications, however, do not require a reservoir for a color-conversion material and, thus, can be mounted on a planar sub-mount. In a particular example, a package includes an optoelectronic device mounted on or integrated in the front-side of a planar semiconductor (e.g., silicon) structure having a thickness of about 200 μm or less. Packages with such thin sub-mounts can be advantageous for some applications, but typically require special handling during the manufacturing process to avoid their becoming damaged.

SUMMARY

The details of one or more implementations of the invention are set forth in the accompanying drawings and the description below. Various aspects of the invention are set forth in the claims.

In one aspect, for example, a package for an optoelectronic device (e.g., a light emitting device such as a LED) includes a sub-mount including a silicon substrate having a thickness in the range of 350 μm-700 μm, and preferably in the range of 400 μm-600 μm. Sub-mounts having a relatively thick substrate (e.g., 350-700 μm) are less prone to damage and can result in a higher manufacturing yield. Such sub-mounts also can be manufactured using a simpler process compared to thinner sub-mounts because carrier wafers for mechanical support are not needed during the fabrication process.

The optoelectronic device can be mounted on a die attach pad on the front-side surface of the substrate. Feed-through metallization in one or more via structures electrically couples the die attach pad to a contact pad on the back-side surface of the substrate.

Each via structure for the feed-through metallization extends through the substrate from the front-side surface to the back-side surface and has inclined walls such that a cross-section of the via structure becomes increasingly narrower in a direction into the substrate from both the front-side and back-side surfaces. In some implementations, each via structure has a cross-section shaped like two substantially regular trapezoids, one atop the other and inverted with respect to one another.

Anode and cathode contact pads on the front-side surface of the substrate can be coupled electrically to surface mount device (SMD) pads on the back-side surface by way of feed-through metallization extending through via structures as mentioned above.

Other features and various advantages of the invention will be apparent from the description and drawings, and from the claims.

DETAILED DESCRIPTION

Figure 1:
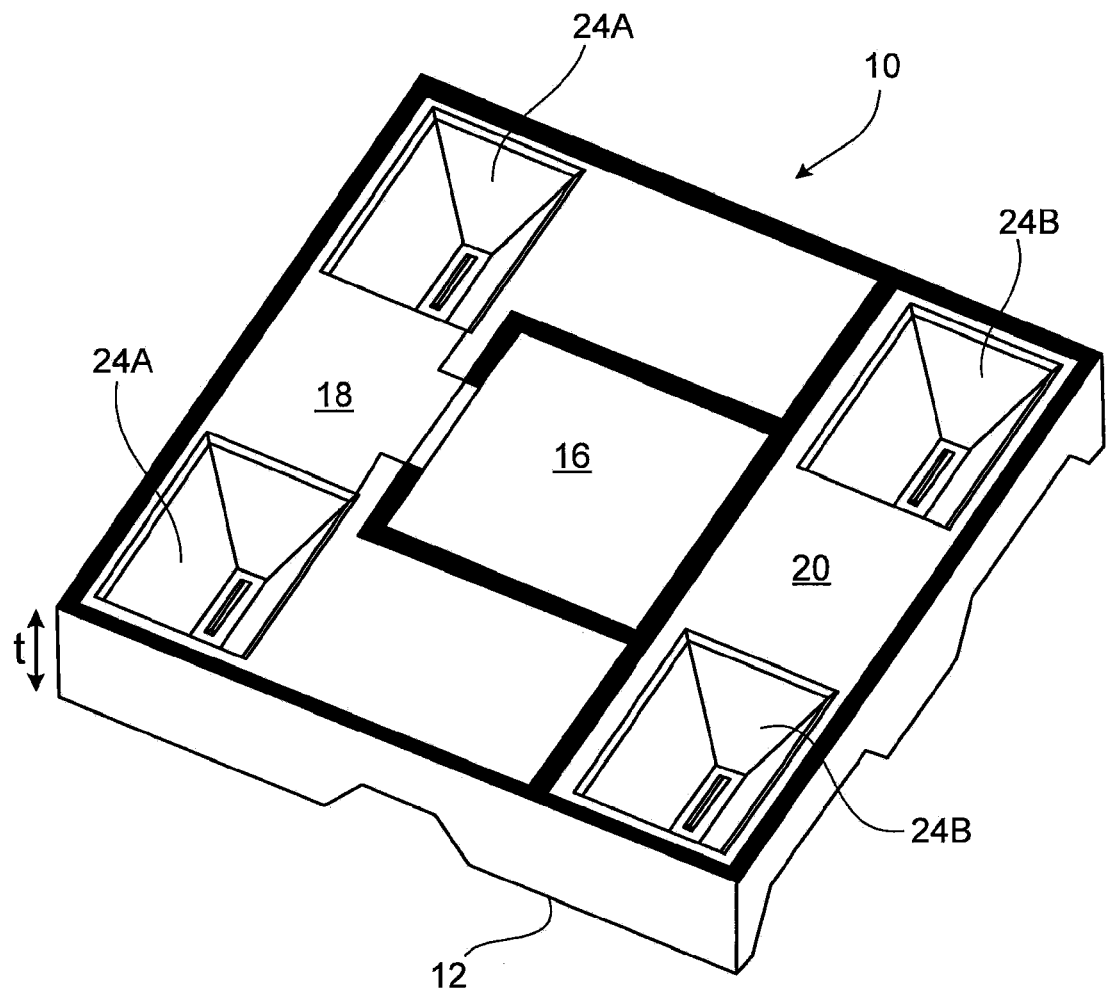
FIG. 1 is an elevated view of a silicon sub-mount according to an example of the invention.
Figure 2:
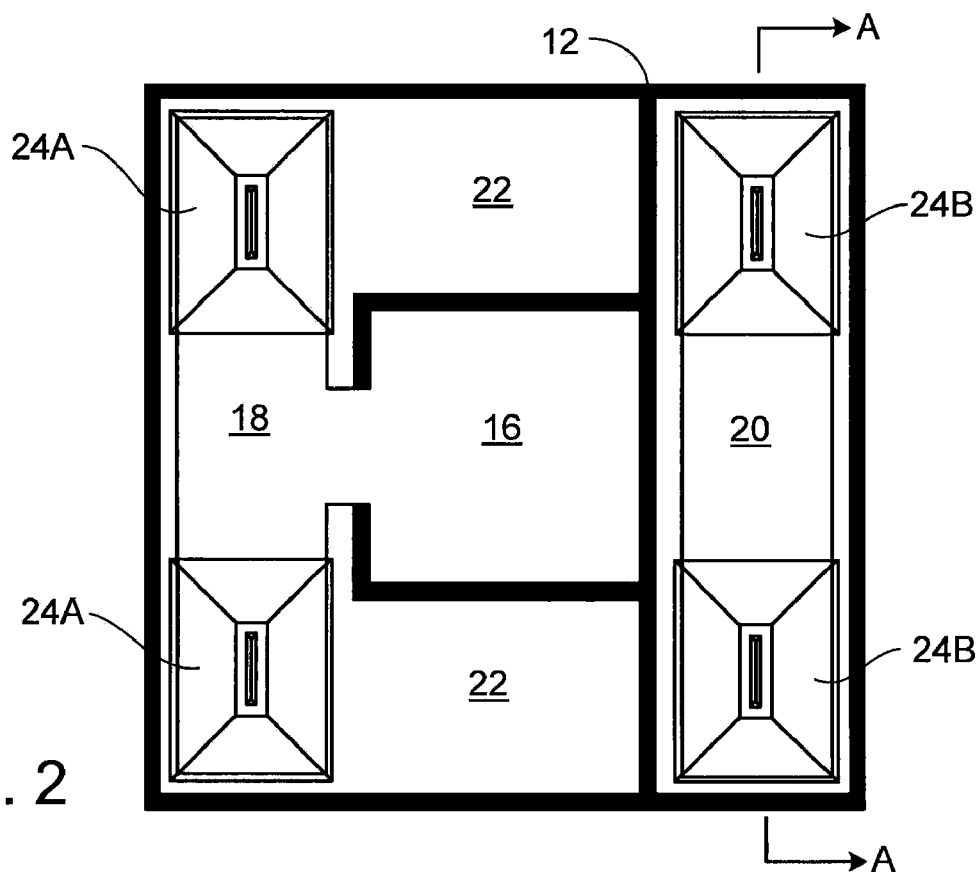
FIG. 2 is a front side view of the sub-mount.
Figure 3:
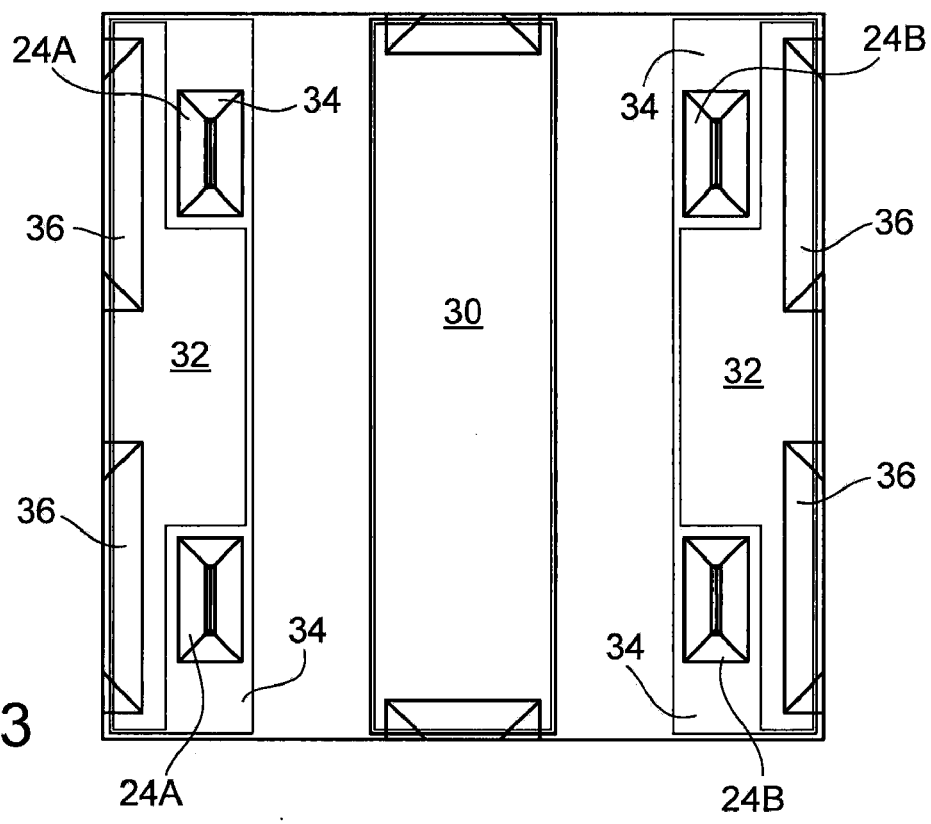
FIG. 3 is a back side view of the sub-mount.

As shown in FIGS. 1, 2 and 3, a sub-mount 10 for an optoelectronic device, such as an LED chip, includes a silicon substrate 12. The substrate has a thickness (t) in the range of 350 μm-700 μm, and preferably in the range of 400 μm-600 μm. The LED chip (not shown) is mounted on a substantially planar front-side surface of the substrate 12. In the illustrated example, the thickness of the substrate is about 500 μm. As described in greater detail below, the sub-mount can be fabricated, for example, in a wafer-level batch process using standard 4-inch to 8-inch diameter silicon wafers without the need to use special carrier wafers to address the handling issues that can arise with sub-mounts having a thickness of less than about 300 μm.

As shown in FIGS. 1 and 2, the front side of the sub-mount 10 includes a die attach pad 16 on which an LED chip (or other optoelectronic chip) can be mounted. The die attach pad 16 is electrically connected to an anode pad 18 on the front-side surface of the substrate 12. A cathode pad 20 also is located on the front-side surface of the substrate 12. Thus, each of the pads 16, 18, 20 is located on a substantially planar front-side surface of the substrate 12. Gold or silver, for example, can be used as the metallization for the die attach pad 16 as well as the anode and cathode pads 18, 20. When an LED chip is mounted on the die attach pad 16, an anode terminal at the bottom of the LED chip is in electrical contact with the die attach pad, which, in turn, is electrically connected to the anode pad 18. A cathode terminal at the top of the LED chip can be electrically connected to the cathode pad 20 by way of a wire bond, for example. In the illustrated example, solder dams 22 are used to prevent solder from flowing onto other areas during fabrication.

Via structures 24A, 24B extend from the front side to the back side of the substrate 12. Feed-through metallization in the via structures 24A, 24B provides electrical connections between the anode and cathode pads 18, 20 on the front side of the sub-mount 10 to respective SMD pads located on the back side of the sub-mount. In the illustrated example, two via structures 24A are provided for electrical connection from the anode 18, and two via structures 24B are provided for electrical connection from the cathode 20. In some implementations, a single via structure for the anode connection and a single via structure for the cathode connection may be sufficient. However, using multiple via structures with feed-through metallization for each of the anode and cathode can increase the amount of current that can be handled.

In the illustrated example, the die attach pad 16 covers an area of about 1050 μm×1050 μm, and the area of the front side of the sub-mount is about 2800 μm×2800 μm. Different dimensions may be suitable for other implementations.

FIG. 3 illustrates an example of the back side of the sub-mount 10 (i.e., the SMD side), which includes a thermal pad 30 for heat transfer away from the LED chip. The thermal pad 30 can be formed, for example, of solderable metallization suitable for, e.g., tin/silver alloy. The via structures 24A, 24B with the feed-through metallization are visible at the SMD side as well. Regions of solderable metal 32, such as gold, nickel, copper or silver, for example, serve as leadless SMD contacts for the anode and cathode. Solder dams 34 can be used to prevent solder from flowing onto other areas during fabrication. Bevel structures (e.g., v-grooves) 36 can facilitate inspection of the sub-mount after soldering, for example, on a printed circuit board (PCB).

The distance between the die attach pad on the front-side surface and the SMD and thermal pads on the back-side surface is approximately the thickness of the silicon substrate.

Figure 4:
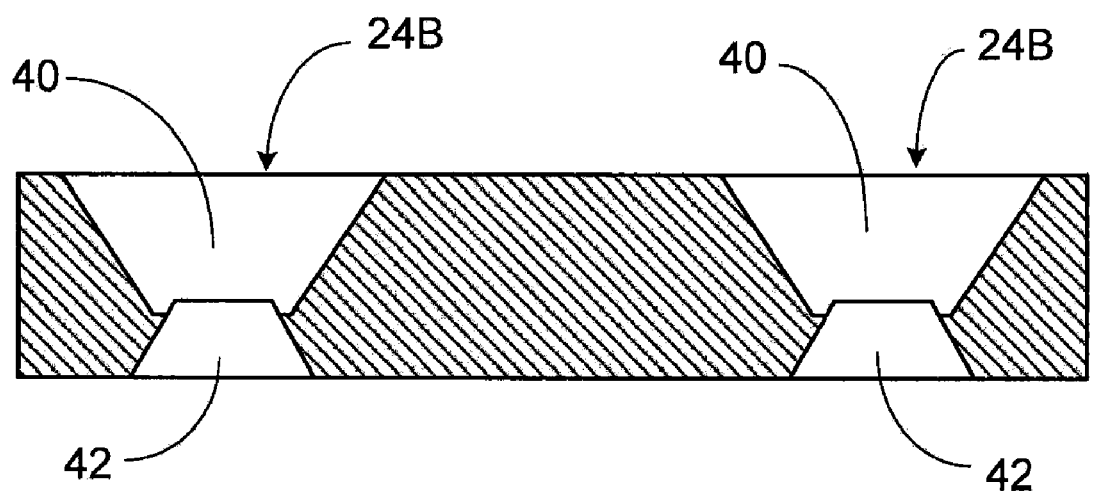
FIG. 4 is a cross-sectional view taken along line A-A of FIG. 2.

FIG. 4 illustrates a cross-sectional view of the sub-mount taken along the line A-A in FIG. 2. Although the cross-sectional view of FIG. 4 illustrates the via structures 24B and feed-through connections for the cathode, the via structures 24A and feed-through connections for the anode can be similar. In the illustrated example, each via structure 24B includes an upper portion 40 with a tapered shape such that its cross-section becomes increasingly narrower from the front-side surface toward the back-side surface, and a lower portion 42 with a tapered shape such that its cross-section becomes increasingly narrower from the back-side surface toward the front-side surface. Thus, each via structure has a combined cross-sectional shape that appears like two substantially regular trapezoids, one atop the other and inverted with respect to one another such that the larger parallel side of one trapezoid is at the front side of the substrate and the larger parallel side of the second trapezoid is at the back side of the substrate. In the illustrated example, the upper portion of the via structure has inclined sidewalls such that the cross-section narrows from the front side (i.e., LED side) of the sub-mount 10 to a depth of about 350 μm, and the lower portion of the via structure widens from a depth of about 350 μm to the back side (i.e., SMD side). In the illustrated example, the opening of the upper via structure at the front side of the sub-mount is larger than the opening of the lower via structure at the back side of the sub-mount. Different dimensions for the vias can be used in other implementations.

An example of a process for fabricating the sub-mount 10 is described in the following paragraphs. As noted above, the sub-mount can be fabricated, for example, in a wafer-level batch process using standard 4-inch to 8-inch diameter silicon wafers. However, for ease of understanding, the process is described with respect to processing a portion of the wafer for a single sub-mount.

Figure 5A:
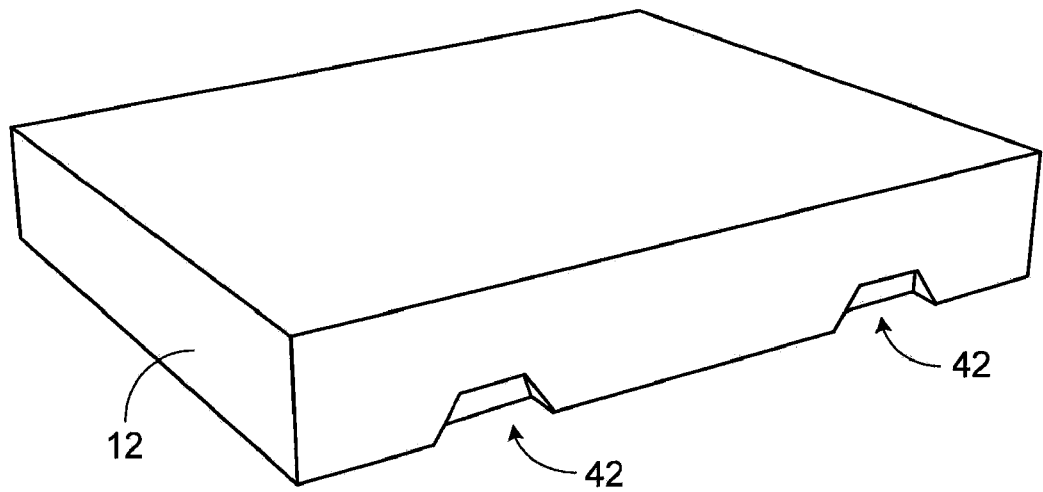
FIG. 5A illustrates an example of formation of a lower portion of a via structure.
Figure 5B:
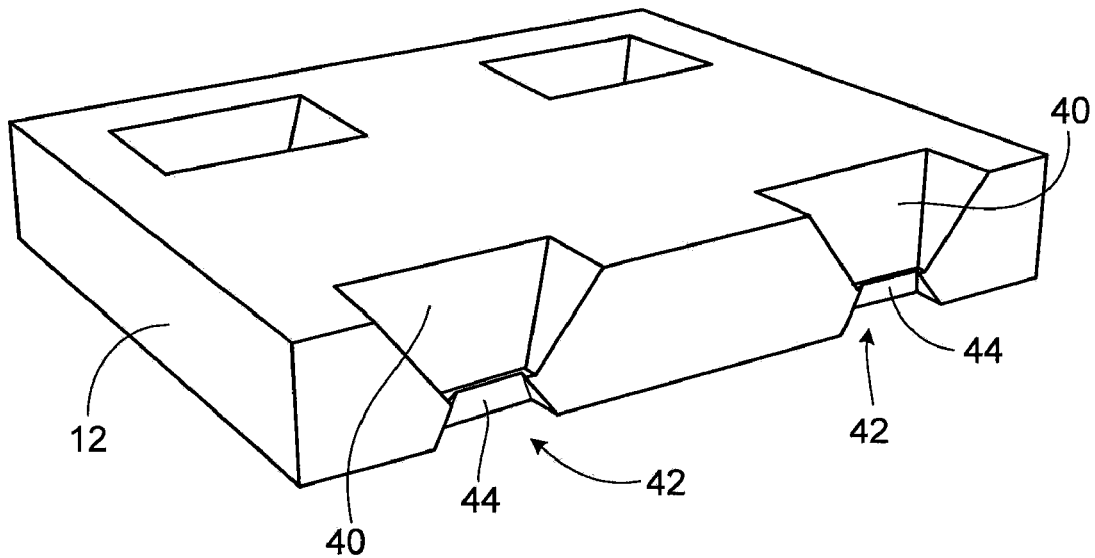
FIG. 5B illustrates an example of formation of an upper portion of the via structure.

As shown in FIG. 5A, the lower portion of the via structure 42 is etched into the back side (i.e., SMD side) of the silicon wafer to a predetermined depth (e.g., about 150 μm) using, for example, a wet chemical etch (e.g., KOH). Next, an etch resistant layer (e.g., 400 nm of $SiO_2$ and 150 nm of SiN) is deposited over both sides of the wafer, including in the vias etched from the back side. As illustrated in FIG. 5B, the front side (i.e., LED side) of the wafer then is etched (e.g., using a timed wet etch) to form the upper portion 40 of the via structure. Preferably, the duration of the timed etch from the front side results in etching slightly beyond the etch resistant $SiO_2$ layer. The thin SiN layer then is removed so that a thin $SiO_2$ membrane 44 of about 400 nm remains between the upper and lower via structures. Over-etching the upper via structure slightly helps ensure that the upper and lower portions of the via structures meet when the oxide layer subsequently is removed in a later step.

Next, a relatively thick (e.g., 1200 nm) thermally-grown $SiO_2$ isolation layer is formed over the front side (i.e., LED side) of the wafer. The relatively thick thermally-grown oxide layer forms on the silicon, but not on the previously-formed thin $SiO_2$ membrane.

Figure 5C:
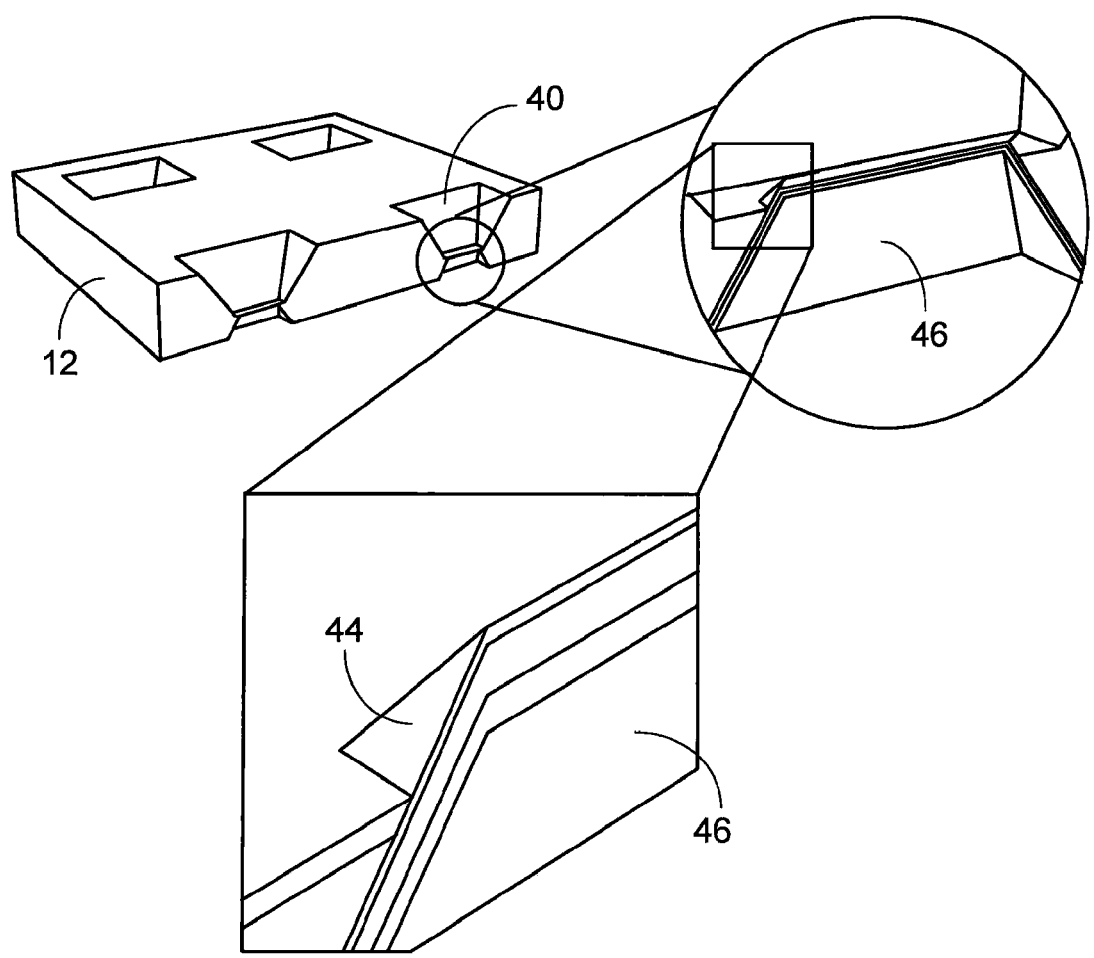
FIG. 5C illustrates an example of deposition of a thin metal film over the back side of the substrate during formation of the sub-mount.
Figure 5D:
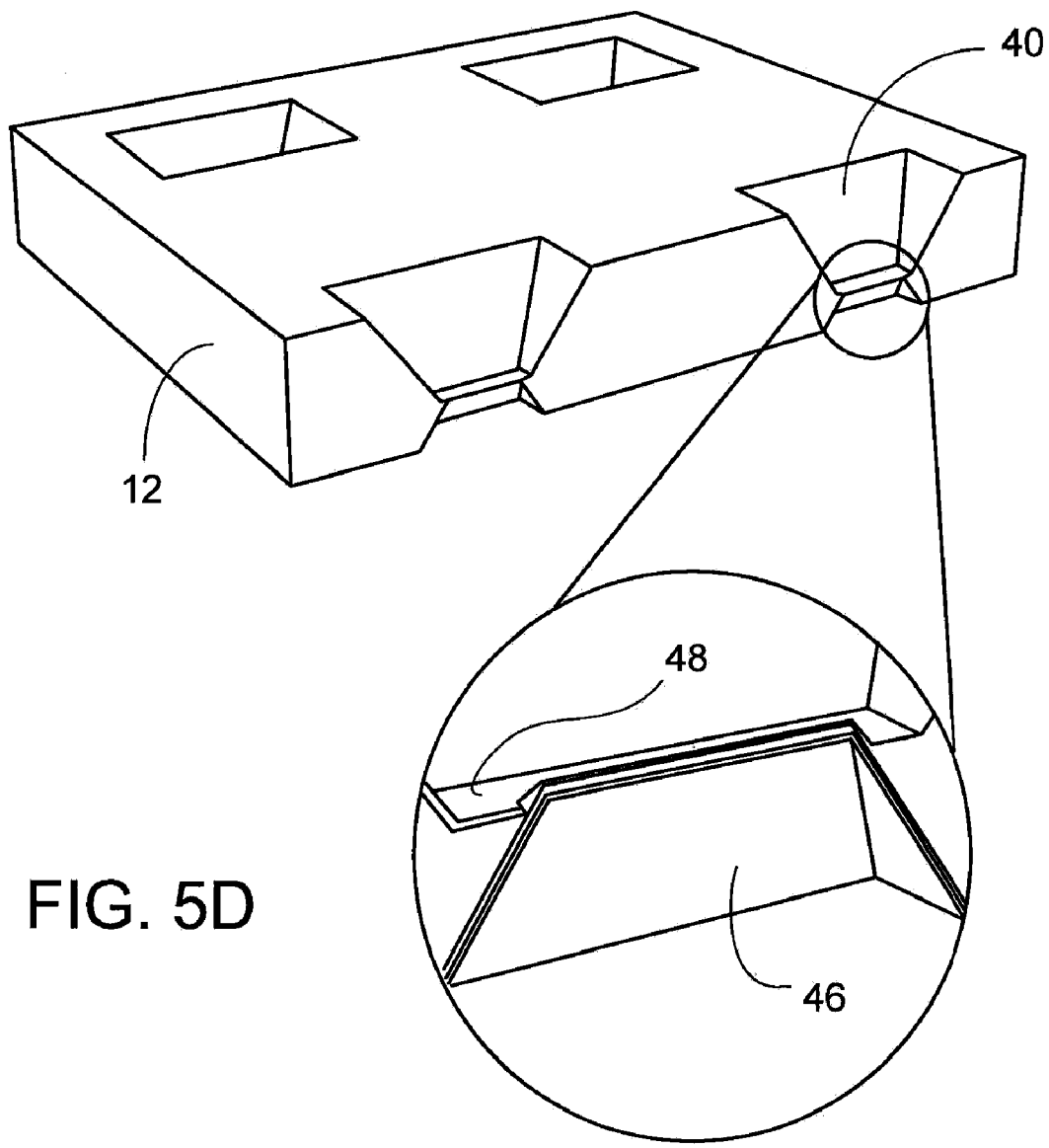
FIG. 5D illustrates an example of deposition of a thin metal film over the front side of the substrate during formation of the sub-mount.

A thin (e.g., sub-micron) metal film 46 then is deposited on the back side (i.e., SMD side) of the wafer (see FIG. 5C). This metal film 46 is deposited inside the lower portion of the via structure as well. The metal film 46 can be formed, for example of AlCu/Ti/Ni/Au.

Next, the oxide layers are etched from the front side (i.e., LED side) of the wafer. The duration of the oxide etch should be just long enough to remove the thin (400 nm) $SiO_2$ membrane 44 previously formed in the vias, thereby exposing the thin metal film in the vias. As the duration of the oxide etch results in removal of only about 400 nm of oxide, approximately 800 nm of oxide remains on the other surfaces of the wafer to provide electrical isolation.

A thin (e.g., sub-micron) film 48 is deposited over the front side (i.e., LED side) of the wafer to form a metallic interface (e.g., ohinic contact) inside each via structure. The thin film 48 can be, for example, AlCu/Ti/Au.

Next, a thin electroplated film (e.g., about 3 μm of Au) is deposited to form the die attach pad 16 and the anode and cathode pads 18, 20. This thin film also can be deposited inside the vias to add mechanical strength to the feed-through connections. Metallization on the front and back sides of the wafer then is patterned to form other features, such as the SMD pads 32 and the thermal pad 30.

Figure 6:
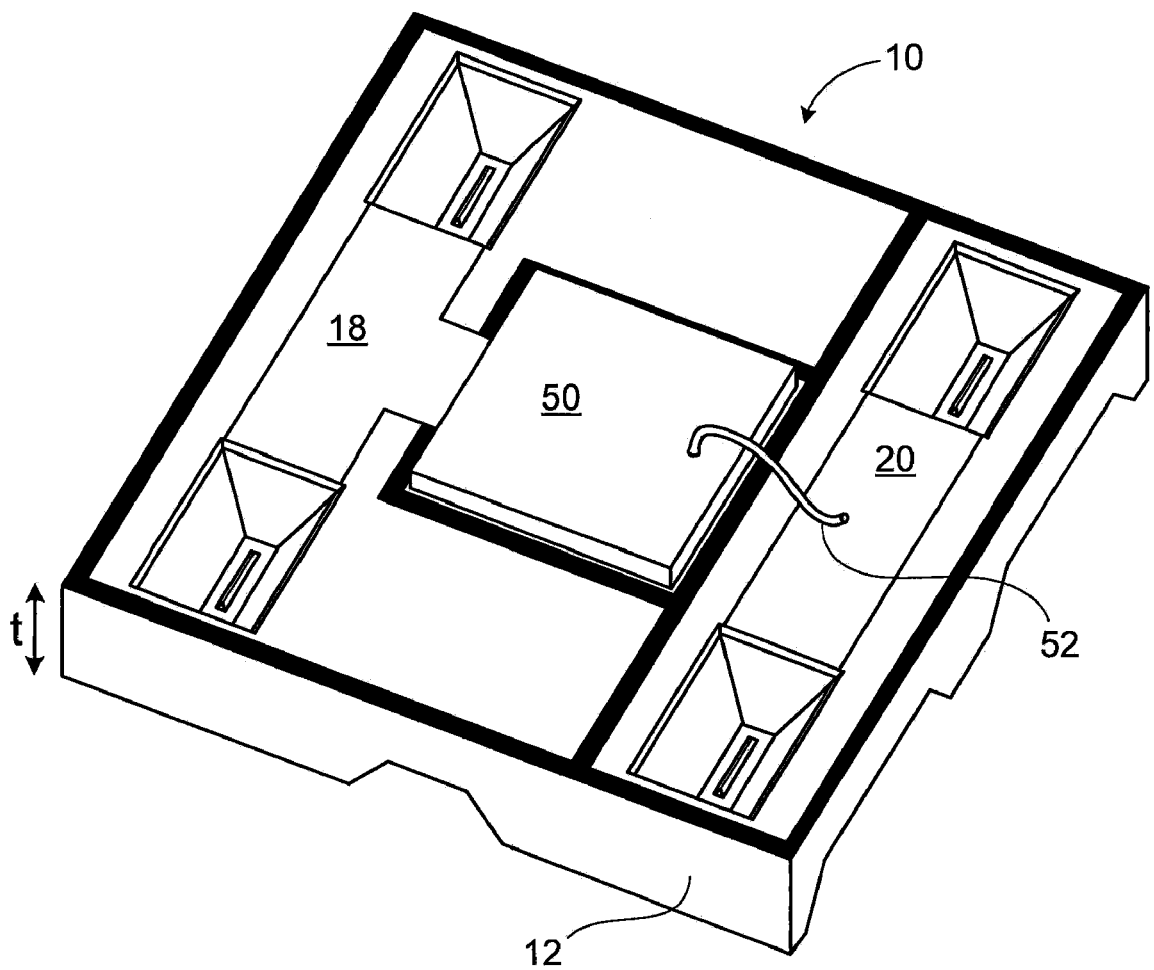
FIG. 6 illustrates an example of a LED chip mounted on the sub-mount.

As shown in FIG. 6, subsequent fabrication steps can include mounting an LED chip 50 on the die attach pad and providing a wire bond connection 52 from the LED chip 50 to the cathode pad 20. In addition, a plastic or glass cup or reflector can be provided over the LED chip 50. The cup or reflector can contain optics for beam-shaping. The foregoing fabrication steps can be performed on a wafer scale or after the wafer has been diced into individual sub-mounts.

Various details of the foregoing process flow can be modified to obtain the same or similar structure of the sub-mount 10 described in connection with FIGS. 1-4.

Using a planar silicon sub-mount as described above can result in the feed-through metallization being closer to the die attach pad. This, in turn, means that the sub-mount can have a smaller footprint compared, for example, to sub-mounts based on ceramic or leadframe technologies. A decrease in the footprint of the sub-mount can be particularly important for mobile phone and other applications where volume, and particularly height, should be as small as feasible.

Furthermore, the ability to use relatively large (e.g., 8-inch diameter) silicon wafers that contain many more dies as compared, for example, to a typical 4-inch ceramic tile can result in more cost-effective manufacturing and assembly.

As noted above, sub-mounts having a relatively thick substrate (e.g., 350-700 μm) are less prone to damage and can result in a higher manufacturing yield. Such sub-mounts also can be manufactured using a simpler process because carrier wafers for mechanical support are not needed during the fabrication process.

Various modifications may be made to the implementations described above without departing from the spirit and scope of the invention. Accordingly, other implementations are within the scope of the claims.

What is claimed is:

1. A sub-mount for an optoelectronic device comprising: a silicon substrate having a thickness in the range of 350 μm-700 μm and having a front-side surface and a back-side surface; a singular die attach pad on which to mount the optoelectronic device, the die attach pad disposed on the front-side surface of the substrate; a front side via structure having a first bottom and inclined walls such that a cross-section of the front side via structure becomes increasingly narrower from the front-side surface toward the back-side surface; a back side via structure having a second bottom and inclined walls such that a cross-section of the back side via structure becomes increasingly narrower from the back-side surface toward the front-side surface, wherein the first bottom and the second bottom are not a same size, and wherein the first bottom and the second bottom meet between the front-side surface and the back-side surface; an insulating layer over the inclined walls of the back side via structure; feed-through metallization over the insulating layers in the back side via structure; a first contact pad disposed on the front-side surface of the substrate and directly electrically contacted at the front-side surface of the substrate to the die attach pad; and a second contact pad disposed on the front-side surface of the substrate and not directly electrically contacted at the front-side surface to the die attach pad, wherein the feed-through metallization in at least one of the via structures electrically couples the die attach pad to a first surface mount device ("SMD") pad on the back-side surface of the substrate.

2. The sub-mount of claim 1 wherein the silicon substrate has a thickness in the range of 400 μm-600 μm.

3. The sub-mount of claim 1 wherein each via structure has a cross-section shaped like two substantially regular trapezoids, one atop the other and inverted with respect to one another.

4. The sub-mount of claim 3 wherein feed-through metallization in at least one of the via structures electrically couples the first contact pad to the first SMD pad on the back-side surface of the substrate, and
wherein feed-through metallization in at least another one of the via structures electrically couples the second contact pad to a second SMD pad on the back-side surface of the substrate.

5. The sub-mount of claim 4 further comprising a thermal pad on the back-side surface of the substrate.

6. The sub-mount of claim 1 wherein the distance between the back-side surface of the substrate and the die attach pad on the front-side surface is substantially the same as the thickness of the substrate.

7. An optoelectronic device package comprising: a sub-mount comprising a silicon substrate having a thickness in the range of 350 μm-700 μm and having a front-side surface and a back-side surface; a singular die attach pad, an anode pad and a cathode pad on the front-side surface of the substrate; first and second SMD pads on the back-side surface of the substrate; a front side via structure having a first bottom and inclined walls such that a cross-section of the front side via structure becomes increasingly narrower from the front-side surface toward the back-side surface; a back side via structure having a second bottom and inclined walls such that a cross-section of the back side via structure becomes increasingly narrower from the back-side surface toward the front-side surface, wherein the first bottom and the second bottom are not a same size, and wherein the first bottom and the second bottom meet between the front-side surface and the back-side surface; an insulating layer over the inclined walls of the back side via structure; feed-through metallization over the insulating layers in the back side via structure; and a light emitting device mounted to the die attach pad; wherein one of the anode pad and the cathode pad is directly electrically contacted at the front-side surface to the die attach pad and the other of the anode pad and the cathode pad is not directly electrically contacted at the front-side surface to the die attach pad; wherein the feed-through metallization in at least one of the via structures electrically couples the anode pad to the first SMD pad and wherein the feed-through metallization in at least another one of the via structures electrically couples the cathode pad to the second SMD pad.

8. The package of claim 7 wherein the silicon substrate has a thickness in the range of 400 μm-600 μm.

9. The package of claim 7 wherein each via structure has a cross-section shaped like two substantially regular trapezoids, one atop the other and inverted with respect to one another.

10. The package of claim 9 wherein the distance between the back-side surface of the substrate and the die attach pad on the front-side surface is substantially the same as the thickness of the substrate.

11. The package of claim 10 wherein the light emitting device comprises a LED chip.

12. The package of claim 7 wherein the anode pad is electrically coupled to the die attach pad, such that the die attach pad is electrically coupled to the first SMD pad.

13. A sub-mount for an optoelectronic device comprising: a silicon substrate having a front-side surface and a back-side surface; a singular die attach pad disposed on the front-side surface of the substrate; a front side via structure having a first bottom and inclined walls such that a cross-section of the front side via structure becomes increasingly narrower from the front-side surface toward the back-side surface; a back side via structure having a second bottom and inclined walls such that a cross-section of the back side via structure becomes increasingly narrower from the back-side surface toward the front-side surface, wherein the first bottom and the second bottom are not a same size, and wherein the first bottom and the second bottom meet between the front-side surface and the back-side surface; an insulating layer over the inclined walls of the inclined walls of the back side via structure; feed-through metallization over the insulating layers in the back side via structure; a first contact pad disposed on the front-side surface of the substrate and directly electrically contacted at the front-side surface to the die attach pad; and a second contact pad disposed on the front-side surface of the substrate and not directly electrically contacted at the front-side surface to the die attach pad, wherein the feed-through metallization in at least one of the via structures electrically couples the die attach pad to a first pad on the back-side surface of the substrate.

14. The sub-mount of claim 13 wherein the silicon substrate has a thickness in the range of 400 μm-600 μm.

15. The sub-mount of claim 13 wherein each via structure has a cross-section shaped like two substantially regular trapezoids, one atop the other and inverted with respect to one another.

16. The sub-mount of claim 13:
wherein feed-through metallization in at least one of the via structures electrically couples the first contact pad to the first pad on the back-side surface of the substrate, and
wherein feed-through metallization in at least another one of the via structures electrically couples the second contact pad to the second pad on the back-side surface of the substrate.

17. The sub-mount of claim 13 further comprising a thermal pad on the back-side surface of the substrate.

18. The sub-mount of claim 13 wherein the distance between the back-side surface of the substrate and the die attach pad on the front-side surface is substantially the same as the thickness of the substrate.

* * * * *